(12) United States Patent
Korobkov

(10) Patent No.: US 7,484,195 B1
(45) Date of Patent: Jan. 27, 2009

(54) METHOD TO IMPROVE TIME DOMAIN SENSITIVITY ANALYSIS PERFORMANCE

(75) Inventor: Alexander Korobkov, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 105 days.

(21) Appl. No.: 11/468,431

(22) Filed: Aug. 30, 2006

(51) Int. Cl.
*G06F 17/50* (2006.01)
*G06F 17/16* (2006.01)

(52) U.S. Cl. .................. 716/6; 703/2; 703/16

(58) Field of Classification Search .............. 716/4, 716/5, 6; 703/2, 16
See application file for complete search history.

(56) References Cited

U.S. PATENT DOCUMENTS

| | | | | | |
|---|---|---|---|---|---|
| 5,566,078 | A | * | 10/1996 | Ding et al. .................. | 716/8 |
| 6,023,571 | A | * | 2/2000 | Matsumoto et al. ........... | 703/2 |
| 6,377,907 | B1 | * | 4/2002 | Waclawski ................... | 702/182 |
| 7,216,309 | B2 | * | 5/2007 | Lee et al. .................... | 716/2 |
| 7,272,543 | B2 | * | 9/2007 | Estevez-Schwarz et al. .... | 703/2 |
| 2004/0261042 | A1 | * | 12/2004 | Lee et al. .................... | 716/2 |
| 2004/0267497 | A1 | * | 12/2004 | Goodman ................... | 702/179 |
| 2005/0049838 | A1 | * | 3/2005 | Danko ......................... | 703/2 |
| 2006/0156260 | A1 | * | 7/2006 | Ciesielski et al. ............. | 716/3 |
| 2006/0184254 | A1 | * | 8/2006 | Carpency et al. ............. | 700/30 |
| 2007/0005308 | A1 | * | 1/2007 | Lee et al. .................... | 703/2 |
| 2007/0136035 | A1 | * | 6/2007 | Minor et al. .................. | 703/2 |
| 2007/0277134 | A1 | * | 11/2007 | Zhang et al. ................. | 716/6 |

* cited by examiner

*Primary Examiner*—Phallaka Kik
(74) *Attorney, Agent, or Firm*—Martine Penilla & Gencarella, LLP

(57) ABSTRACT

A method for performing sensitivity analysis on a circuit design is provided. The method initiates with identifying a partition of the circuit design. The method includes determining whether the partition belongs to a sensitivity graph, where the sensitivity graph represents a relationship between variables and parameters of the partition. If the partition belongs to the sensitivity graph, then the method includes, applying linear matrix factors to provide a solution to a system of linear equations and multiplying the solution by a vector to derive sensitivities for the circuit design.

18 Claims, 3 Drawing Sheets

METHOD TO IMPROVE TIME DOMAIN SENSITIVITY ANALYSIS PERFORMANCE

BACKGROUND

Sensitivity Analysis is a technique widely used in multiple technical areas to monitor how small variations of a system parameter can affect the output variables dependent on that parameter. One such area is VLSI electrical circuit simulation where sensitivity parameters are circuit element parameters such as transistor channel width, length, resistance, capacitance, current sources, etc. In this context, the purpose of the sensitivity analysis is to evaluate how performance functions such as delay, slew rate, power, and noise margin are affected by small circuit parameter variations. The results obtained from this analysis are then used in the design process in such areas as design optimization, power analysis, statistical analysis, timing, and noise analysis.

Currently, there are two major approaches to obtain sensitivities from time domain circuit simulations: the adjoint method and the direct method. The adjoint method computes the sensitivity of one output variable with respect to all of the circuit parameters. The direct method provides sensitivity values of all circuit variables with respect to a single parameter. The drawbacks to each method can easily be seen. The adjoint method only allows the computation of sensitivity values based on a single output variable, whereas the direct method only allows computations involving a single parameter. Additionally, the adjoint method for transient analysis is based on Tellegen's theorem and requires that Jacobian matrices of the original circuit be stored at each time point.

Neither of the two major approaches provides an optimal solution from a design automation standpoint to be used on large networks. A new approach is needed that will combine the best features of both methods while eliminating the drawbacks. That is, a Sensitivity Analysis method that combines the best of the two major approaches (adjoint and direct methods), that can also be used with fast simulation tools is needed.

SUMMARY

Broadly speaking, the present invention fills these needs by providing a method and an apparatus for performing sensitivity analysis on a circuit design. It should be appreciated that the present invention can be implemented in numerous ways, including as a method, a system, or a device. Several inventive embodiments of the present invention are described below.

In accordance with one embodiment of the present invention, a method for performing sensitivity analysis on a circuit design is provided. The method initiates with identifying a partition of the circuit design. The method includes determining whether the partition belongs to a sensitivity graph, the sensitivity graph representing a relationship between variables and parameters of the partition. If the partition belongs to the sensitivity graph, then the method includes, applying linear matrix factors computed during the nominal transient analysis, to provide a solution to a system of sensitivity equations and derive sensitivities for the circuit design.

In accordance with another embodiment of the present invention, a computer readable medium having program instructions for performing sensitivity analysis on a circuit design is provided. The computer readable medium includes program instructions for identifying a partition of the chip design and program instructions for generating a matrix and a vector for the partition. Program instructions for determining whether the partition belongs to a sensitivity graph are included. Program instructions for applying linear matrix factors associated with the matrix to provide a solution to a system of linear equations if the partition belongs to the sensitivity graph, and program instructions for multiplying the solution by a vector to derive sensitivities for the chip design are also included on the computer readable medium.

In accordance with yet another embodiment of the present invention, a computer implemented system for performing sensitivity analysis on a circuit design is provided. The computer implemented system includes a bus and a memory that includes sensitivity analysis logic. A monitor configured to display various data is included. The system includes a processor in communication with the memory and the monitor through the bus, the processor operable to receive instructions which, when executed by the processor, cause the processor to generate sensitivities for the circuit design based on each partition of the circuit design, wherein the generation of the sensitivities reuse linear matrix factors and estimates a partial derivative through a finite difference.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for hardware implemented methods and an apparatus for practicing the Method to Improve Time Domain Sensitivity Analysis Performance. It will be obvious, however, to one skilled in the art, that the present invention may be practiced without some or all of these specific details. In other instances, well known process operations have not been described in detail in order not to unnecessarily obscure the present invention.

The embodiments described below employ a combination of the adjoint and direct methods by use of the direct differentiation modified algorithm (DDMA) with adaptations for fast simulation. The approach utilizes the basic features of the fast circuit simulation engine, which are circuit partitioning (the entire circuit matrix is partitioned by channel connected component, to reduce its complexity) and event driven analysis (partitions are simulated under inputs activity criteria only) This approach uses direct differentiation of nodal equations and solves an adjoint resistive circuit at each time point and provides adaptations for fast simulation so that the method is not applicable to "ordinary" circuit simulation tools such as SPICE3F5, or commercial tools like SYNOPSYS HSPICE, SILVACO SMARTSPICE, etc. Thus, the embodiments described herein are applicable to "fast" simulation tools such as SUNSIM (an in house tool of the assignee), or commercial tools like SYNOPSYS NANOSIM, HSIM, CADENCE ULTRASIM, etc.

Figure 1:
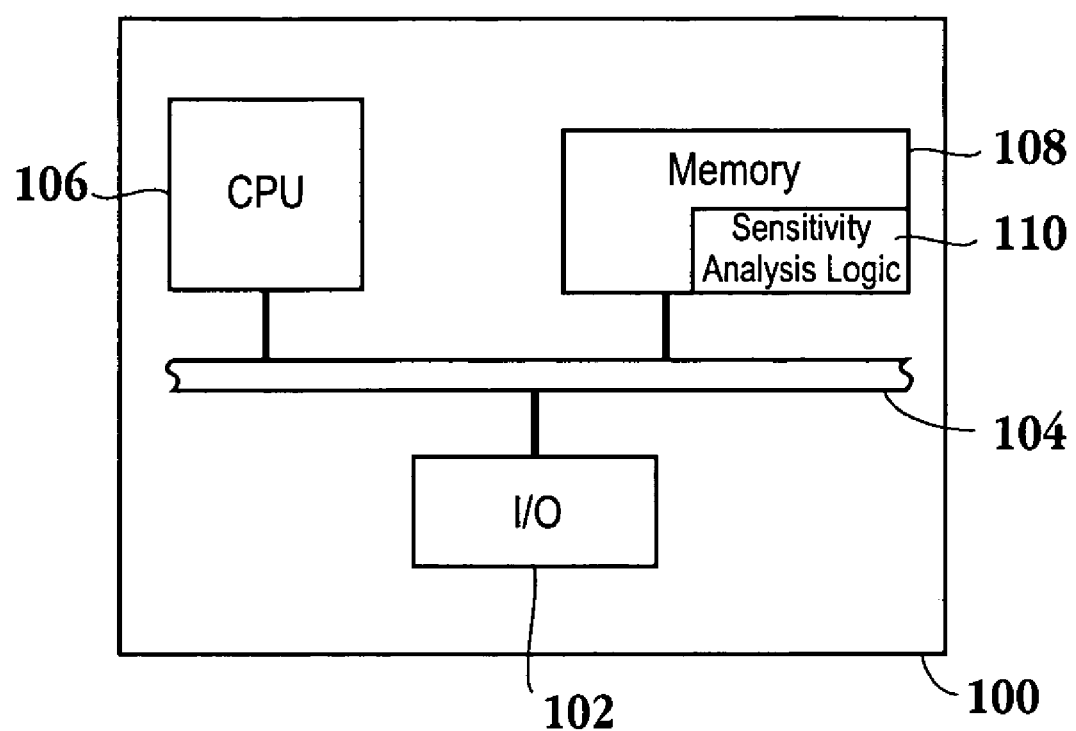
FIG. 1 is a Block Diagram of a Conventional Computer System that may be used to implement the invention.

FIG. 1 is a block diagram that illustrates a computer system 100 upon which an embodiment of the invention may be implemented. Computer system 100 includes an input and output block 102, a bus 104 or other communication mechanism for communicating information, a CPU 106, and memory 108. The memory 108 includes sensitivity analysis logic 110. Computer system 100 is used to execute sensitivity analysis logic 110 through CPU 106. According to one embodiment of the invention, computer system 100 is used to execute a sequence of instructions that allows the computer to perform sensitivity analysis on a circuit design. Sensitivity analysis logic 110 for these instructions is stored in memory 108 as software code in accordance with one embodiment. A netlist representing an entire complex circuit is written into memory 108 and separated into smaller circuits known as partitions. The sensitivity analysis logic 110 allows access and selection of a single partition, or multiple partitions to be used in the desired circuit analysis. The sensitivity logic 110 is configured to associate a specific partition with a specific variable and use those values to calculate the sensitivity analysis. The association between the partition and variable will depend on which user parameters have been selected to be used to predict circuit performance based on changes made to those parameters. In one embodiment, execution of the sensitivity analysis logic 110 provides the functionality described with reference to FIG. 2.

The sensitivity analysis logic 110 is configured to use the partition and sensitivity information in calculating the final desired sensitivity analysis. The sensitivity analysis logic 110 is also configured to make any necessary computations, store any intermediate factors or estimates needed in those computations, and store any ultimate result determined from those calculations. Processor 106 directs information to the monitor 102 via a standard interface. Processor 106 is also configured to receive and execute instructions to generate sensitivities for the circuit design.

Figure 2:
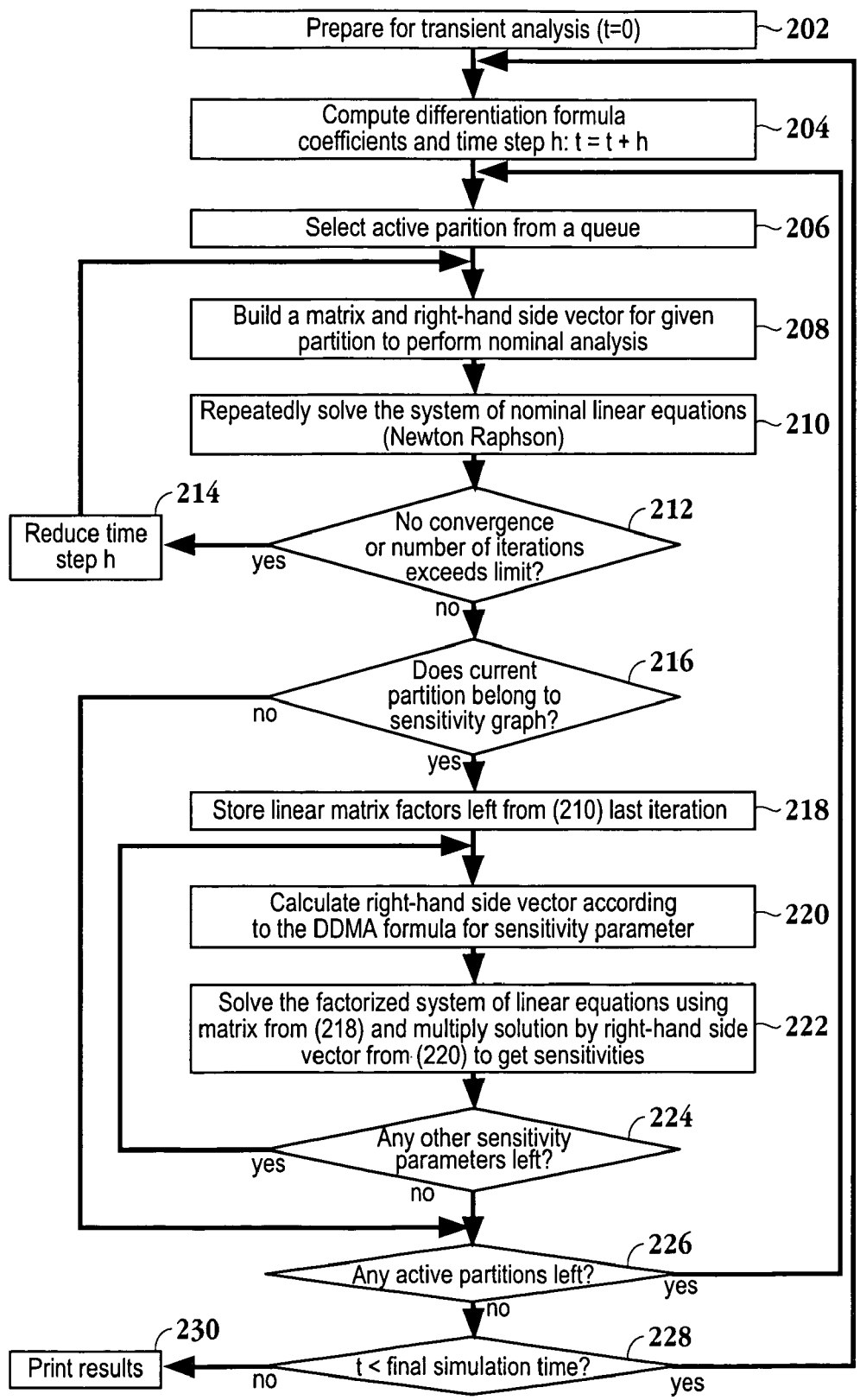
FIG. 2 is a Flow Chart of the Differentiation Algorithm, in accordance with one embodiment of the invention.

FIG. 2 is a Flow Chart of the Differentiation Algorithm, in accordance with one embodiment of the invention. The sequence of steps to perform circuit simulation is initialized in operation 202. In operation 204 differentiation formula coefficients and time step h: t=t+h are computed. The differentiation formula coefficients are derived based on the implicit integration method and state variables value at the current and the previous integration steps. In operation 206 an active partition is selected from a queue. It should be appreciated that this selection is based on user selected parameters to be used for the sensitivity analysis. The active partition may represent any portion of the circuit design. In operation 208 a matrix and right-hand side vector are built for a given partition to perform nominal analysis. The right-hand side vector can be expressed by the right-hand side of the multi-parameter sensitivity equations that are built by direct differentiation of the nominal system of linear equations in the form 'G*v=j', where x is a vector of unknown state variables, j is a vector of input excitations and G is a discretized circuit conductance matrix. After the differentiation with respect to arbitrary parameter p;

$$(dG/dp)*v+G*(dv/dp)=dj/dp==>G*(dv/dp)=dj/dp-(dG/dp)*v,$$

where 'dj/dp−(dG/dp)*v' is a right-hand side of the system of sensitivity equation associated with the parameter p.

In operation 210 the logic repeatedly solves the system of nominal linear equations using the Newton-Raphson method. Operation 212 is a decision block which tests to see if any convergence or number of iterations exceeds a pre-programmed limit. If there is no convergence or the number of iterations does not exceed a pre-programmed limit, the logic proceeds to block 214 to reduce time step h and returns to operation 208 and repeats as described above. If there is convergence or the number of iterations exceeds a pre-programmed limit, the logic proceeds to operation 216. Operation 216 is a decision block that initiates the sensitivity analysis. If the current partition belongs to the sensitivity graph, that is, if based on the user parameters selected the logic has identified the partition as one which will need to be used to calculate the sensitivity, then the method proceeds to operation 218 to store linear matrix factors left from the last iteration determined previously in operation 210. These linear matrix factors may be expressed as explained below. In the system of sensitivity equations above, the inverse matrix 1/G calculated during the nominal analysis does not depend on parameter p and therefore can be reused for sensitivity equation, as follows:

$$dv/dp=(1/G)*(dj/dp-(dG/dp)*v)$$

where 'dj/dp−(dG/dp)*v' has to be updated for every sensitivity parameter p, but (1/G) can be calculated only once.

Linear matrix factors are calculated by matrix G decomposition by lower and upper triangular matrices (LU decomposition):

$$G*v=L*U*v=j$$

Then, the system is solved by replacing L*u by unknown variable x and back-substitution:

$$U*v=x==>L*x=j=>x=(1/L)*j==>v=(1/U)*x \text{ Since}$$
matrices C, L, U does not depend on parameter p, 1/L and 1/U can be calculated once and reused for all sensitivity parameters.

If the partition does not belong to the sensitivity graph, the method proceeds to operation 226.

From operation 218, the method of FIG. 2 advances to operation 220 where the right-hand side vector is calculated according to the Direct Differentiation Modified Algorithm (DDMA) formula for a desired sensitivity parameter. The DDMA formula for right-hand side part of sensitivity equations can be simplified to:

$$dj/dp-(dG/dp)*v$$

The method then proceeds to operation 222 to solve the factorized system of linear equations using the matrix from operation 218. This solution is then multiplied by the right-hand side vector from operation 220 to obtain the sensitivities. In operation 224 it is decided if there are any other sensitivity parameters remaining. If there are no other sensitivity parameters left, the method proceeds to decision operation 226 to decide if there are any active partitions remaining. If there are other sensitivity parameters left, the method returns to operation 220 and repeats as described above. In decision operation 226 if there are not any active partitions left the method advances to operation 228. In operation 228 a test is performed to see if t is less than the final simulation time, where t is a simulation time associated with the integration step where sensitivities are being calculated. If t is not less than the final simulation time the results are printed in operation 230, if t is less than the final simulation time then the method returns to operation 204 and repeats as described above.

It should be appreciated that the Finite difference formula is intended to calculate sensitivity of the state variable v with respect to parameter p as follows:

dv/dp~(v−v1)/dp, where v is a nominal value, v1 is a value due to the small variation of parameter p: dp It is beneficial to use a finite formula vs analytical formula, because of the event-driven nature of fast circuit simulation procedure as mentioned above.

Figure 3:
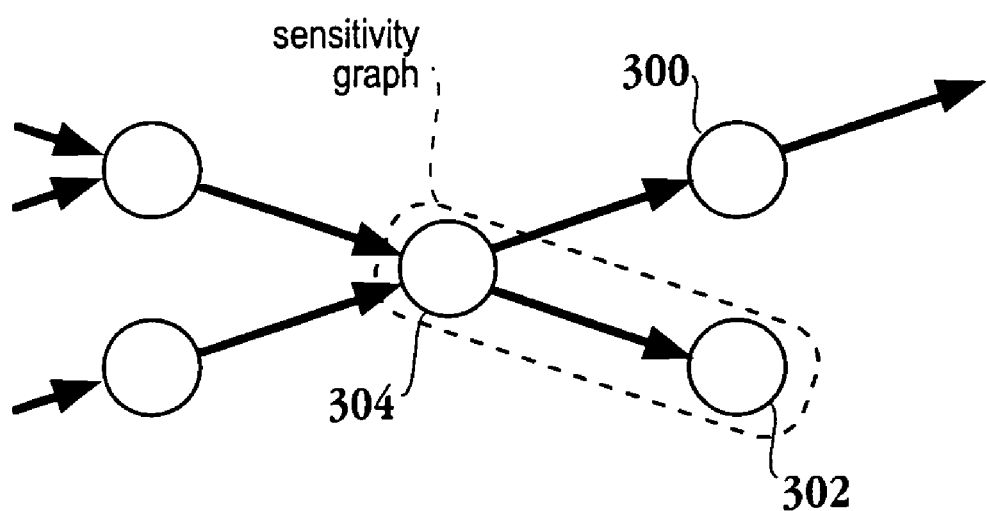
FIG. 3 is a Sensitivity Graph that describes the relationship between Parameters, Partitions, and Variables in accordance with one embodiment of the invention.

FIG. 3 is a Sensitivity Graph that describes the relationship between Parameters, Partitions, and Variables in accordance with one embodiment of the invention. When a given parameter 304 is chosen for analysis, that parameter 304 belongs to one partition 300, and one variable 302, for which a derivative is calculated. The Sensitivity Graph shows the dependency between each parameter 304 and each variable 302, this relationship is represented by the dotted line which encircles variable 302 and parameter 304. Calculations to solve for sensitivity are not performed on those partitions which are not in the graph. The arrows represent that the process is unidirectional and is continuous for as long as calculations are necessary or desired.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention can also be embodied as computer readable code on a computer readable medium. The computer readable medium is any data storage device that can store data which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The above described invention may be practiced with other computer system configurations including hand-held devices, microprocessor systems, microprocessor-based or programmable consumer electronics, minicomputers, mainframe computers and the like. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A method for performing sensitivity analysis on a circuit design, comprising:
   identifying a partition of the circuit design;
   determining whether the partition belongs to a sensitivity graph, the sensitivity graph representing a relationship between variables and parameters of the partition;
   if the partition belongs to the sensitivity graph, then the method includes,
   applying linear matrix factors computed during a nominal transient analysis to provide a solution to a system of sensitivity equations; and
   deriving sensitivities for the circuit design from the solution.

2. The method of claim 1, wherein the partition is comprised of circuit variables and parameters.

3. The method of claim 1, wherein calculations are made on selected partitions without having to simultaneously perform calculations on remaining partitions.

4. The method of claim 1, wherein a vector of the matrix includes parameter values and variable values.

5. The method of claim 4, wherein the parameters include circuit element parameters comprising:
   transistor channel width and length, resistance, capacitance, current sources, and voltage sources, and the parameter values are mathematical results that represent those parameters.

6. The method of claim 4, wherein the variables are circuit output variables comprising:
   circuit delay, slew rate, power, and noise margin, and the variable values are mathematical results that represent those variables.

7. A data storage device having program instructions stored thereon, wherein when executed by a computer, cause the computer to perform:
   identifying a partition of the circuit design;
   generating a matrix and a vector for the partition;
   determining whether the partition belongs to a sensitivity graph;
   applying linear matrix factors computed during a nominal transient analysis to provide a solution to a system of sensitivity equations; and
   deriving sensitivities for the circuit design from the solution.

8. The data storage device of claim 7, wherein the matrix and the vector are comprised of circuit variables and parameters.

9. The data storage device of claim 8, wherein the parameters are circuit element parameters such as comprising:
   transistor channel width and length, resistance, capacitance, current sources, and voltage sources.

10. The data storage device of claim 8, wherein the variables are circuit output variables comprising:
    circuit delay, slew rate, power, noise margin, and other common circuit output variables.

11. The data storage device of claim 7, wherein the sensitivity graph represents a relationship between variables and parameters.

12. The data storage device of claim 7, wherein linear matrix factors are reused for making further calculations.

13. A computer implemented system for performing sensitivity analysis on a circuit design, comprising:
   a bus;
   a memory including sensitivity analysis logic;
   a monitor configured to display various data;
   a processor in communication with the memory and the monitor through the bus, the processor operable to receive instructions which, when executed by the processor, cause the processor to generate sensitivities for the circuit design based on each partition of the circuit design, wherein the generation of the sensitivities reuse linear matrix factors and estimates a partial derivative through a finite difference.

14. The computer implemented system of claim 13, wherein the sensitivity analysis logic is used as part of a circuit simulation.

15. The computer implemented system of claim 13, wherein the circuit simulation is used to estimate an impact of small circuit parameter variations on circuit performance.

16. The computer implemented system of claim 15, wherein the small circuit parameter variations are achieved by varying circuit element parameters comprising:
   transistor channel width and length, resistance, capacitance, current sources, and voltage sources.

17. The computer implemented system of claim 15, wherein the circuit performance considers circuit timing, noise, power analysis, design optimization, and statistical analysis.

18. The computer implemented system of claim 13, wherein the sensitivity analysis logic is used to implement a sensitivity logic analysis without a need for any explicit analytical expressions.

* * * * *